United States Patent
Fang et al.

[11] Patent Number: 6,117,798
[45] Date of Patent: Sep. 12, 2000

[54] METHOD OF SPIN-ON-GLASS PLANARIZATION

[75] Inventors: Cheng-Yu Fang, Taipei; Chih-Chiang Liu, Hsinchu, both of Taiwan

[73] Assignee: United Microelectronics Corp., Hsinchu, Taiwan

[21] Appl. No.: 09/215,654

[22] Filed: Dec. 16, 1998

[51] Int. Cl.[7] .......................... H01L 21/31; H01L 21/469

[52] U.S. Cl. .......................... 438/782; 438/633; 438/692; 438/780

[58] Field of Search ...................... 438/782, 633, 438/690–692, 695, 697–699, 778–781

[56] References Cited

U.S. PATENT DOCUMENTS

| | | | |
|---|---|---|---|
| 5,607,880 | 3/1997 | Suzuki et al. | 438/624 |
| 5,747,381 | 5/1998 | Wu et al. | 438/624 |
| 5,783,482 | 7/1998 | Lee et al. | 438/624 |
| 5,948,700 | 9/1999 | Zheng et al. | 438/694 |
| 6,030,706 | 2/2000 | Eissa et al. | 438/421 |
| 6,030,892 | 2/2000 | Wu et al. | 438/633 |

*Primary Examiner*—Charles Bowers
*Assistant Examiner*—Thanh Nguyen
*Attorney, Agent, or Firm*—Charles C. H. Wu; Charles C. H. Wu & Associates, APC

[57] ABSTRACT

A method of spin-on-glass planarization. A spin-on-glass layer is formed on a substrate. An accuflo layer with a better fluidity than the spin-on-glass material is formed on the spin-on-glass layer. The accuflo layer and the spin-on-glass layer are etched back by two etching steps with different etching rate. The accuflo layer after being etched is stripped. A dielectric layer is formed.

21 Claims, 3 Drawing Sheets

METHOD OF SPIN-ON-GLASS PLANARIZATION

BACKGROUND OF THE INVENTION

1. Field of the Invention

The invention relates to a method of planarization, and more particularly, to a method of spin-on-glass (SOG) planarization.

2. Description of the Related Art

To fabricate metal interconnects on a wafer with a limited surface area, and to meet the requirement of the booming technology of integrated circuit, more than one metal layers are required to achieve a multilevel interconnection. The metal layers are isolated by dielectric material to avoid a short circuit. However, an uneven surface profile of the integrated circuit is typically formed due to the formation of the metal layers. The uneven surface profile causes the formation of voids in the subsequently formed dielectric layer. In addition, it is difficult to form another metal layer on a dielectric layer with an uneven surface. Therefore, a planarization process is typically performed on the dielectric layer.

Spin-on-glass is a widely applied planarization method in semiconductor. A solvent containing dielectric material is evenly spin coated on a wafer. The dielectric material is carried by the solvent which flows on the surface of the wafer. The dielectric material is thus easily filled into gaps or trenches of an uneven surface of the wafer. Using a thermal treatment, the solvent is removed to cure the spin-on glass. The planarization is thus achieved. The gap filling property of spin-on-glass technique is often applied to solve the problems of the formation of voids within a dielectric layer.

FIG. 1A to FIG. 1C shows a conventional spin-on-glass process for forming a sandwich type dielectric layer. In FIG. 1A, conductive wires 102a, 102b and 102c are formed on a substrate 100. A conformal dielectric layer 104 is to cover the substrate 100 and the conductive wires 102a to 102c. Two to three times of spin coating are performed on the dielectric layer 104. After a curing process, a spin-on-glass layer 106 is formed on the dielectric layer 104. The SOG layer 106 is apparently thicker over the conductive wire 102a which has a larger surface area.

In FIG. 1B, an etch back process is performed on the SOG layer 106. The SOG layer 106 over the conductive wires 102a to 102c is removed until the underlying dielectric layer 104 is exposed. The resultant SOG layer is then denoted as 106a.

In FIG. 1C, a dielectric layer 108 is formed to cover the dielectric layer 104 over the conductive wires 102a to 102c and the SOG layer 106a.

Due to the absorption of SOG material, the SOG layer 106 (FIG. 1A) over the conductive wires 102a to 102c have to be removed to prevent a subsequently formed contact window being poisoned by the evaporated of water or moisture absorbed by the SOG layer. As mentioned above, the SOG layer 106 is thicker over a larger surface such as the conductive wire 102a. To remove the thicker part of the SOG layer 106 over the larger surface, recessed or hollow surface is formed in other parts of the SOG layer as shown in FIG. 1B. The planarization is thus affected.

To improve the level of planarity, FIG. 2A to FIG. 2B shows another conventional method ot planarization. In FIG. 2A, conductive wires 202a, 202b, and 202c are formed on a substrate. A conformal dielectric layer 204 is formed to cover the conductive wires 202a to 202c and the substrate 200. Two to three times of spin-on-glass coating are performed on the dielectric layer 204. After a curing process, a SOG layer 206 is formed on the dielectric layer 204. A dielectric layer 208 and a photo-resist layer 210 is formed on the SOG layer 206.

In FIG. 2B, an etch back process is performed to planarize the photo-resist layer 210 and the dielectric layer 208. The photo-resist layer 210 is stripped, and a part of the dielectric layer 208 is removed until the dielectric layer 204 over the conductive wires 202a to 202c is exposed. The remaining dielectric layer is denoted as 208a.

By the above method, the level of planarity is enhanced. However, as the thickness to be etched back is large, so that a long etching back time is consumed. To perform the etching back process with a long time often causes a thicker part in the central of the wafer, and a thinner part on the edge. Defects thus easily occur on the edge of a wafer. In addition, the SOG layer is partly remained over the conductive wires, so that a contact window formed subsequently is very likely to be poisoned.

SUMMARY OF THE INVENTION

It is therefore an object of the invention to provide a method for spin-on-glass planarization. The hollow or recessed region of a SOG layer is prevented from being formed while performing, a sandwich type SOG planarization process. Moreover, the problem of resulting a wafer with a thicker central part and a thinner edge part is solved. The problem of poisoning a contact window is also resolved.

To achieve these objects and advantages, and in accordance with the purpose of the invention, as embodied and broadly described herein, the invention is directed towards a method of spin-on-glass planarization. A conductive wiring is formed on a substrate. A conformal dielectric layer is formed to cover the conductive wiring and the substrate. A SOG layer is formed on the conformal dielectric layer. An accuflo layer is formed on the SOG layer. The accuflo layer and the SOG layer are etched back until the conformal dielectric layer over the conductive wiring is exposed. Another dielectric layer is formed on the accuflo layer and the exposed conformal dielectric layer. Since the accuflo layer has a better fluidity compared to the SOG layer, a better planarity is achieved compared to the formation of a single SOG layer. Moreover, the accuflo layer has a selectivity different to that of the SOG layer while etching, back, so that the recessedr hollow surface is prevented from being formed.

It is to be understood that both the foregoing general description and the following detailed description are exemplary and explanatory only and are not restrictive of the invention, as claimed.

DESCRIPTION OF THE PREFERRED EMBODIMENTS

Figure 1A:
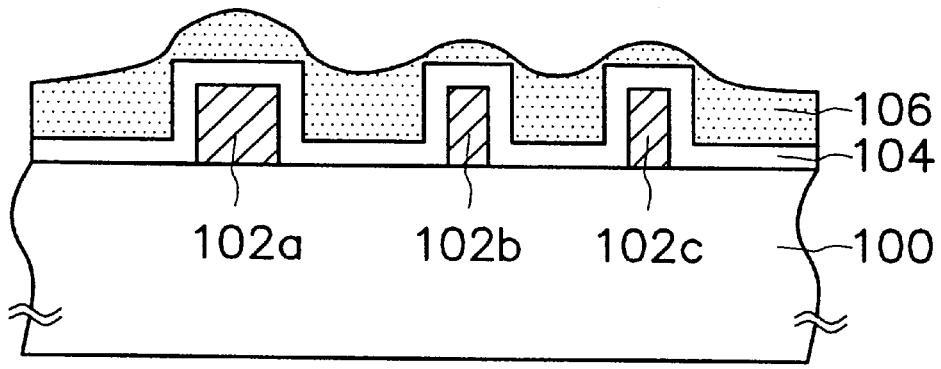
FIG. 1A to FIG. 1C are cross sectional views showing a conventional fabrication process for spin-on-glass planarization.
Figure 1B:
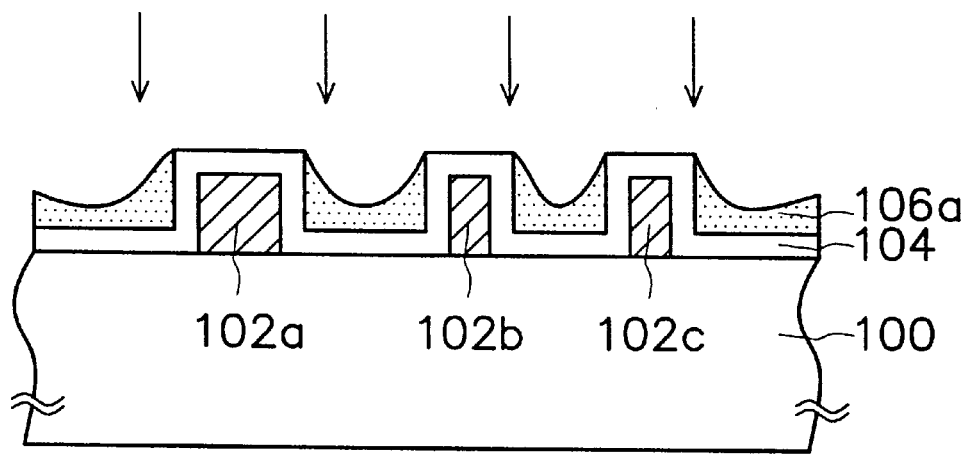
Figure 1C:
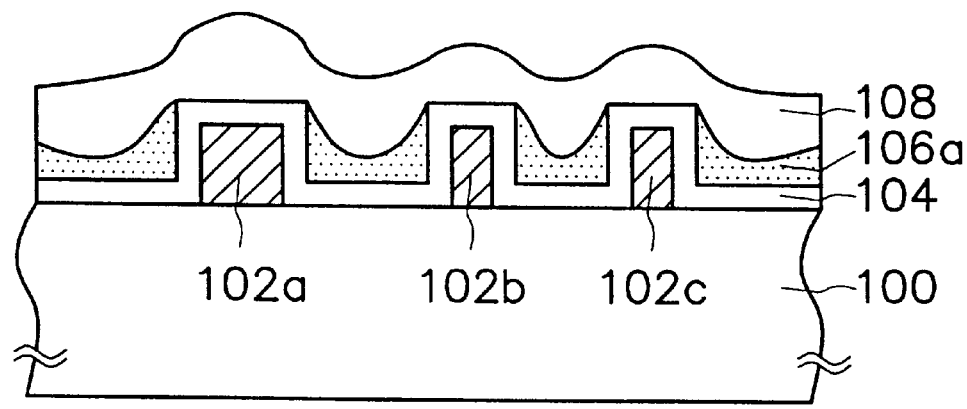
Figure 2A:
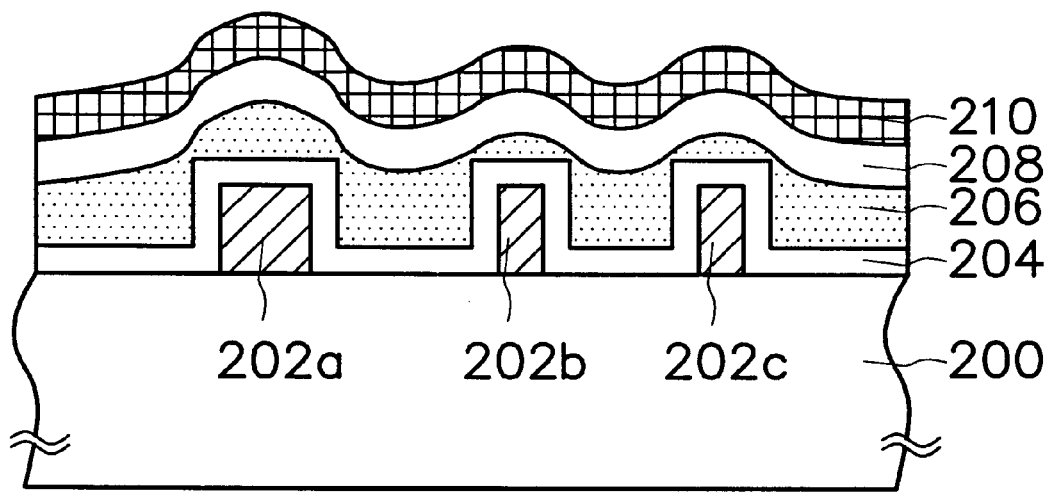
FIG. 2A and FIG. 2B show another conventional planarization fabrication process, and FIG. 3A to FIG. 3C shows a method of spin-on-glass planarization in a preferred embodiment according to the invention.
Figure 2B:
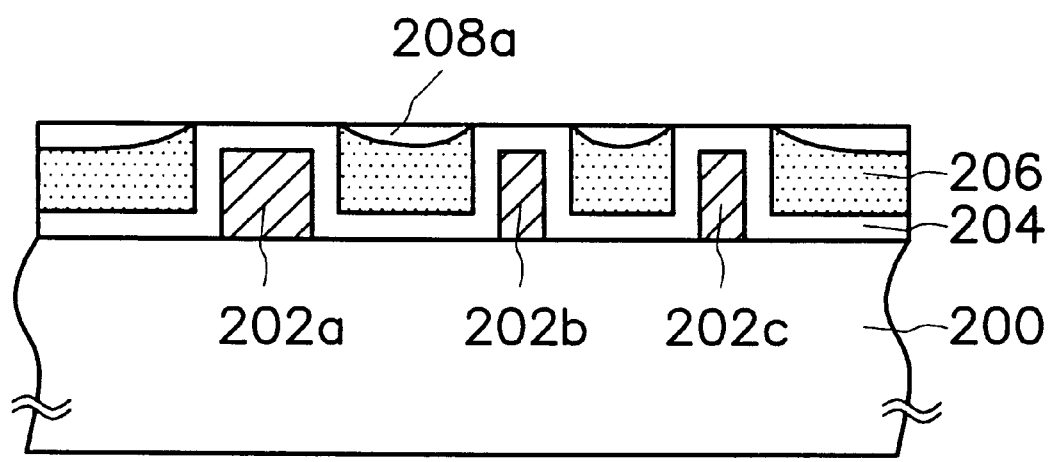
Figure 3A:
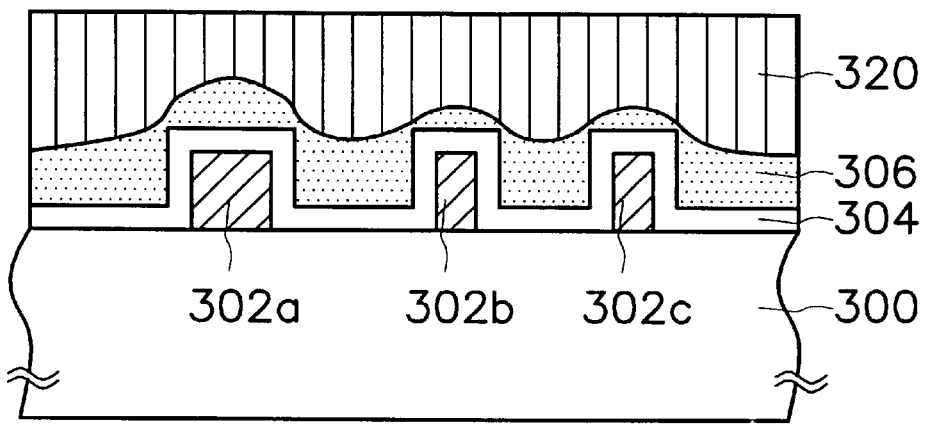

In FIG. 3A, a semiconductor substrate 300 having a conductive wiring 302a, 302b, and 302c thereon is provided.

A conformal dielectric layer 304, for example, a silicon oxide layer formed by plasma enhanced chemical vapor deposition (PECVD), is formed to cover the conductive wiring 302a to 302c and the substrate 300.

A spin-on-glass coating step is performed on the conformal dielectric layer 304. A high temperature curing process is performed to form a SOG layer 306 covering the conformal dielectric layer 304. The material of the SOG layer 306 includes silicate, siloxane, or other materials having similar chemical property, while the solvent to dissolve the material of the SOG layer 306 includes alcohol, ketone, or other solvent having similar chemical property. The spinner used to form the SOG layer 306 is preferably operated with 200 to 500 rpm, and preferably, the SOG layer 306 is formed with a thickness of about 2000 Å to 5000 Å. A transnaturing step, for example, an ion implantation or plasma treatment, is performed on the SOG 306 to suppress the characteristic of wafer or moisture absorption. An accuflo layer 320 is formed on the SOG layer 306. The accuflo layer 320 has a better mobility or fluidity than the SOG layer 306. Therefore, an even more planarized surface is obtained by the formation of the accuflo layer 320.

Figure 3B:
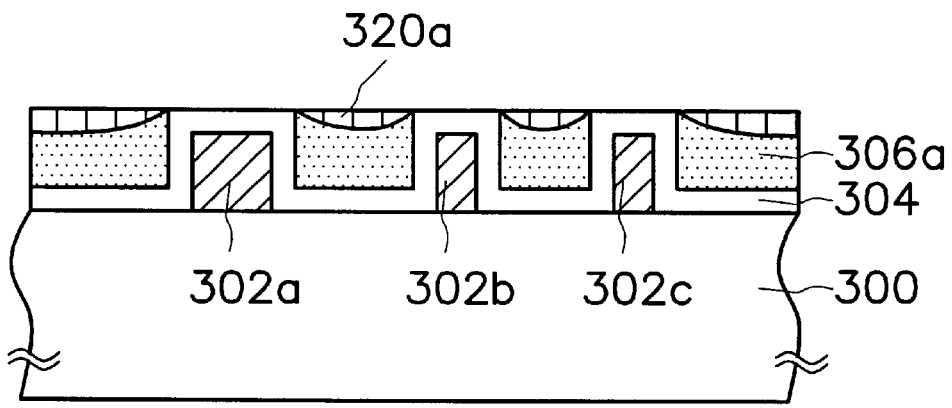

In FIG. 3B, the accuflo layer 320 and the SOG layer 306 are planarized, for example, by etching back. A part of the accuflo layer 320 and the SOG layer 306 aligned over the conductive wiring 302a to 302c are removed until the conformal dielectric layer 304 is exposed. Being planarized, the remaining accuflo layer and the remaining SOG layer are denoted as 320a and 306a, respectively. The etching back process is preferably a dry etching process. The selectivity of the etching process is controlled with a faster etching rate of the accuflo layer 320 to that of the SOG layer 306. While a part of the SOG layer 306, for example, the SOG layer 306 over the conductive wiring 302a, is exposed, the selectivity is adjusted to a faster etching rate of the SOG layer 306 compared to the accuflo layer 320.

By controlling the selectivity between the accuflo layer 320 and the SOG layer 306, the SOG layer 306 over a conductive wiring such as 302a with a larger surface area is removed without forming a recessed or hollow surface on the other parts of the SOG layer 306. Moreover, since the etching rate is adjusted faster to the accuflo layer 320 at first, so that the etching time is not as long as it consumed by the conventional method.

Figure 3C:
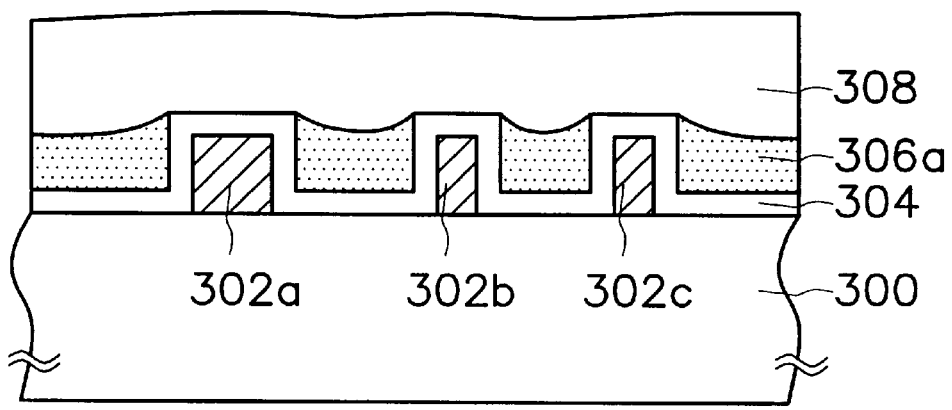

In FIG. 3C, the remaining accuflo layer 320a is stripped, for example, by the method of stripping a photo-resist layer. That is, the accuflo layer 320a is stripped by plasma, followed by a ash or contamination cleaning step. The gas source of the plasma includes oxygen, while the solvent used for the cleaning step includes acetone, aromatic organic solvent, or inorganic solvent such as sulfuric acid and perhydrol. A dielectric layer 308, for example, a silicon oxide layer formed by PECVD, is formed over the conformal dielectric layer 304 and the remaining SOG layer 306a.

In the invention, an accuflo layer 320 is coated over the SOG layer 306 before planarization. The better fluidity of the accuflo material compared to the SOG material obtains a further planarized surface. By controlling the selectivity between the accuflo material and the SOG material, the planarity is further improved. Moreover, the time consumed by planarization step is reduced to obtain a uniform wafer. The residue of the SOG layer over the conductive wiring with a larger surface area is avoided. Therefore, any contact window formed subsequently is not poisoned.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of spin-on-glass planarization, comprising:
   providing a substrate having a conductive wiring thereon;
   forming a conformal dielectric layer on the substrate and the conductive wiring;
   forming a spin-on-glass on the conformal dielectric layer;
   forming an accuflo layer on the spin-on-glass layer;
   etching the accuflo layer with a first etching selectivity until the spin-on-glass is exposed,
   etching the accuflo layer and the spin-on-glass with a second etching selectivity until the conformal dielectric layer over the conductive wiring is exposed;
   stripping the remaining etched accuflo layer; and
   forming a dielectric layer to cover the etched spin-on-glass layer and the exposed conformal dielectric layer.

2. The method according to claim 1, wherein the spin-on-glass layer is formed from silicate.

3. The method according to claim 1, wherein the spin-on-glass layer is formed from siloxane.

4. The method according to claim 1, comprising further a step of transnaturing the spin-on-glass layer.

5. The method according to claim 4, wherein the step of transnaturing the spin-on-glass including a step of suppressing water absorption by the spin-on-glass layer.

6. The method according to claim 4, wherein the step of transnaturing the spin-on-glass layer includes an ion implantation process.

7. The method according to claim 4, wherein the step of transnaturing the spin-on-glass includes a plasma treatment.

8. The method according to claim 1, wherein the first etching selectivity has a faster etching rate of the accuflo layer compared to an etching rate of the spin-on-glass.

9. The method according to claim 1, wherein the second etching selectivity has a faster etching rate of the spin-on-glass layer compared to an etching rate of the accuflo layer.

10. The method according to claim 1, wherein the etched accuflo layer is stripped as a method to strip a photo-resist layer.

11. The method according to claim 1, wherein the remaining etched accuflo layer is stripped by a plasma treatment.

12. The method according to claim 11, wherein the plasma treatment is performed with a gas source includes oxygen.

13. The method according to claim 1, comprising further a step of ash and contamination cleaning after stripping the remaining etched accuflo layer.

14. The method according to claim 13, wherein the cleaning step uses an aceton solvent.

15. The method according to claim 13, wherein the cleaning step uses an aromatic organic solvent.

16. The method according to claim 13, wherein the cleaning step uses a sulfuric acid solvent.

17. The method according to claim 13, wherein the cleaning step uses a perhydrol solvent.

18. A method of spin-on-glass planarization, comprising:
   providing a substrate having a conductive wiring thereon;
   forming a conformal dielectric layer on the substrate and the conductive wiring;
   forming a spin-on-glass on the conformal dielectric layer;
   performing a water absorption suppressing treatment on the spin-on-glass layer;
   forming an accuflo layer on the spin-on-glass layer;

etching the accuflo layer and the spin-on-glass until the conformal dielectric layer over the conductive wiring is exposed;

stripping the remaining etched accuflo layer; and forming a dielectric layer to cover the etched spin-on-glass layer and the exposed conformal dielectric layer.

19. The method according to claim 18, wherein the water absorption suppressing step includes ion implantation.

20. The method according to claim 18, wherein the water absorption suppressing step includes plasma treatment.

21. The method according to claim 18, wherein the step of etching the accuflo layer and the spin-on-glass further comprises:

etching the accuflo layer with a first etching selectivity until the spin-on-glass layer is exposed; and etching the accuflo layer and the spin-on-glass layer with a second etching selectivity until the conformal dielectric layer is exposed; wherein the first etching selectivity has a faster etching rate of the accuflo layer compared to the spin-on-glass layer; and the second etching selectivity has a faster etching rate of the spin-on-glass layer compared to the accuflo layer.

\* \* \* \* \*